United States Patent
Ren et al.

(10) Patent No.: US 12,095,135 B2
(45) Date of Patent: Sep. 17, 2024

(54) ULTRA-WIDEBAND ELECTROMAGNETIC BAND GAP (EBG) STRUCTURE AND CIRCUIT BOARD

(71) Applicant: Anhui University, Hefei (CN)

(72) Inventors: Xingang Ren, Hefei (CN); Shengyang Wei, Hefei (CN); Yali Zhao, Hefei (CN); Guoxing Sun, Hefei (CN); Jiayu Rao, Hefei (CN); Gang Wang, Hefei (CN); Kaikun Niu, Hefei (CN); Xianliang Wu, Hefei (CN); Zhixiang Huang, Hefei (CN); Yingsong Li, Hefei (CN); Yong Peng, Hefei (CN)

(73) Assignee: Anhui University, Hefei (CN)

( * ) Notice: Subject to any disclaimer, the term of this patent is extended or adjusted under 35 U.S.C. 154(b) by 0 days.

(21) Appl. No.: 18/539,132

(22) Filed: Dec. 13, 2023

(65) Prior Publication Data
US 2024/0120633 A1    Apr. 11, 2024

(30) Foreign Application Priority Data
Aug. 24, 2023    (CN) .................. 202311068387.X

(51) Int. Cl.
*H01P 7/00* (2006.01)
*H05K 1/02* (2006.01)

(52) U.S. Cl.
CPC .............. *H01P 7/00* (2013.01); *H05K 1/0236* (2013.01)

(58) Field of Classification Search
CPC ............................... H01P 7/00; H05K 1/0236
See application file for complete search history.

(56) References Cited

U.S. PATENT DOCUMENTS

2012/0086463 A1    4/2012    Boybay

FOREIGN PATENT DOCUMENTS

| CN | 102630127 A | * | 8/2012 |  |
|----|-------------|---|--------|--|
| CN | 104168710 A |   | 11/2014 |  |
| CN | 206461068 U |   | 9/2017 |  |
| CN | 206461909 U |   | 9/2017 |  |
| CN | 108182321 A | * | 6/2018 | ............. G06F 30/23 |
| CN | 211702540 U |   | 10/2020 |  |
| CN | 112738975 A | * | 4/2021 |  |

OTHER PUBLICATIONS

Yali Zhoa and Haorn Zhu, "A Novel EBG Power Plane Structure for Ultrawideband Suppression of SSN in High Speed Circuits" 2020 Cross Strait Radio and Wireless technology Conference pp. 1-3.*

* cited by examiner

*Primary Examiner* — Andrea Lindgren Baltzell
*Assistant Examiner* — Kimberly E Glenn

(57) ABSTRACT

An ultra-wideband electromagnetic band gap (EBG) structure includes multiple EBG units in an array. Each EBG unit includes a power plane, a dielectric substrate and a ground plane from top to bottom. The power plane includes a patch, a coupled complementary split ring resonator (C-CSRR) and a plurality of semi-improved Z-bridge structures. Each edge of the patch is provided with a semi-improved Z-bridge structure. The C-CSRR is provided within a ring formed by the semi-improved Z-bridge structures. The Z-bridge structure includes a first horizontal branch, a first vertical branch, a second horizontal branch and a second vertical branch connected in sequence. The second vertical branch is connected to the patch. First horizontal branches of adjacent EBG units are connected to each other. A circuit board including the aforementioned EBG structure is also provided.

7 Claims, 16 Drawing Sheets

ULTRA-WIDEBAND ELECTROMAGNETIC BAND GAP (EBG) STRUCTURE AND CIRCUIT BOARD

CROSS-REFERENCE TO RELATED APPLICATIONS

This application claims the benefit of priority from Chinese Patent Application No. 202311068387.X, filed on Aug. 24, 2023. The content of the aforementioned application, including any intervening amendments thereto, is incorporated herein by reference in its entirety.

TECHNICAL FIELD

This application relates to electromagnetic band gap structures, and more specifically to an ultra-wideband electromagnetic band gap (EBG) structure and a circuit board.

BACKGROUND

As the integrated circuit is developed, the clock operating rate of the high-speed digital in a hybrid circuit system is continuously accelerated, and the signal rise/fall time is increasingly shortened, rendering the simultaneous switching noise (SSN) more and more prominent. The SSN propagates in a parallel-plate waveguide formed by the power of a circuit board and the ground, which is prone to provoking planar resonance, further leading to voltage fluctuations in a power distribution network (PDN) or multilayer printed circuit board (PCB). In this case, serious signal integrity (SI) problems will occur. In view of this, extensive attention has been paid to the exploration and development of new methods to suppress broadband SSN in mixed-signal systems.

One of the typical SSN suppression methods is to install grounded decoupling capacitors near the noise source, but the number and location of the introduced decoupling capacitors will affect the degree of noise suppression. When the frequency is higher than a few hundred MHz, the decoupling capacitors will generate parasitic inductance, which will further produce self-resonance with the capacitors, limiting the frequency bandwidth, and thus failing to suppress the SSN effectively.

Electromagnetic band gap (EBG) structure can suppress the propagation of noise with a frequency above GHz. The EBG structure is a periodic structure with high impedance characteristics, which can block the propagation of electromagnetic waves in specific frequency bands. Typical EBG structures include mushroom-type EBG structure and coplanar EBG structure. The mushroom-type EBG structure has larger manufacturing complexity and manufacturing cost. In contrast, the coplanar EBG structure is simple and often used to suppress SSN, but the etched pattern on the power plane will destroy the integrity of the power plane, thereby deteriorating the signal integrity (SI). In addition, the current EBG structures also suffer from the following problems: the lower cutoff frequency is not low enough; the suppression depth is not large enough; and the suppression range is not wide enough. Therefore, the SSN cannot be effectively suppressed by the existing EBG structures.

SUMMARY

An objective of the present disclosure is to provide an ultra-wideband electromagnetic band gap (EBG) structure and a circuit board to effectively suppress simultaneous switching noise (SSN).

To achieve the above objective, this application provides the following technical solutions.

In a first aspect, this application provides an ultra-wideband electromagnetic band gap (EBG) structure, comprising:
  a plurality of EBG units arranged in an array;
  wherein each of the plurality of EBG units comprises a power plane, a dielectric substrate and a ground plane arranged sequentially from top to bottom;
  the power plane comprises a patch, a coupled complementary split ring resonator (C-CSRR) and a plurality of semi-improved Z-bridge structures;
  the C-CSRR is embedded in the patch; and each edge of the patch is provided with at least one of the plurality of semi-improved Z-bridge structures; the C-CSRR is provided within a ring formed by the plurality of semi-improved Z-bridge structures; each of the plurality of semi-improved Z-bridge structures comprises a first horizontal branch, a first vertical branch, a second horizontal branch and a second vertical branch connected in sequence; the second vertical branch is connected to the patch; the first horizontal branch is parallel to the second horizontal branch; the first vertical branch is parallel to the second vertical branch; the first horizontal branch is perpendicular to the first vertical branch; and first horizontal branches of adjacent EBG units are connected to each other.

In some embodiments, a distance between the first horizontal branch and the second horizontal branch, a distance between the second horizontal branch and the patch, a width of the second vertical branch and a width of the second horizontal branch are equal; and a width of the first horizontal branch is equal to a width of the first vertical branch, and is smaller than the width of the second horizontal branch.

In some embodiments, the C-CSRR comprises a first rectangular ring and a second rectangular ring; and the second rectangular ring is provided within the first rectangular ring;
  a side of the first rectangular ring is provided with a first opening; a side of the first opening close to the plurality of semi-improved Z-bridge structures is provided with a pair of first coupling wires; and each of the pair of first coupling wires is perpendicularly connected to an end of the first opening; and
  a side of the second rectangular ring is provided with a second opening; a side of the second opening close to a center of the patch is provided with a pair of second coupling wires; each of the pair of second coupling wires is perpendicularly connected to an end of the second opening; and a connection line between the first opening and the second opening is configured to pass through the center of the patch.

In some embodiments, the power plane is made of copper.

In some embodiments, the dielectric substrate is made of a glass fiber-reinforced epoxy resin, and has a relative dielectric constant of 4.4 and a loss tangent of 0.02.

In some embodiments, the ground plane is made of copper.

In some embodiments, a thickness of the power plane is the same as that of the ground plane.

In a second aspect, this application provides a circuit board, comprising:
  a top dielectric substrate;
  a bottom dielectric substrate; and
  the aforementioned ultra-wideband EBG structure;

wherein the power plane of each of the plurality of EBG units is provided between the dielectric substrate and the top dielectric substrate; and the ground plane of each of the plurality of EBG units is provided between the dielectric substrate and the bottom dielectric substrate.

The present application has at least the following beneficial effects according to the specific embodiments.

The present disclosure provides an EBG structure, which includes a plurality of EBG units arranged in an array. Each of the plurality of EBG units includes a power plane, a dielectric substrate and a ground plane arranged sequentially from top to bottom. The power plane includes a patch, a coupled complementary split ring resonator (C-CSRR) and a plurality of semi-improved Z-bridge structures. The C-CSRR is embedded in the patch. Each edge of the patch is provided with a semi-improved Z-bridge structure. The C-CSRR is provided within a ring formed by the plurality of the semi-improved Z-bridge structures. Each of the plurality of semi-improved Z-bridge structures includes a first horizontal branch, a first vertical branch, a second horizontal branch and a second vertical branch connected in sequence. The second vertical branch is connected to the patch. The first horizontal branch is parallel to the second horizontal branch. The first vertical branch is parallel to the second vertical branch. The first horizontal branch is perpendicular to the first vertical branch. First horizontal branches of adjacent EBG units are connected to each other. The series inductance between the EBG units is increased by the Z-bridge formed by the semi-improved Z-bridge structures of the adjacent EBG units, providing a stopband effect. The inductive inductance generated by the semi-improved Z-bridge structure and the C-CSRR, and the gap capacitance generated between the resonant rings can effectively suppress the SSN.

In addition, the circuit board provided by the present disclosure has desirable signal integrity.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

To more clearly illustrate the technical solutions in the embodiments of the present disclosure or in the prior art, the accompanying drawings needed in the description of embodiments will be briefly introduced. Obviously, presented in the accompanying drawings are only some embodiments of the present disclosure. For one of ordinary skill in the art, other accompanying drawings can be obtained based on these drawings without making creative labor.

FIG. 7: 0.035 mm; FIG. 8: 0.05 mm; FIG. 9: 0.07 mm; and FIG. 10: 0.1 mm;

Figure 1:
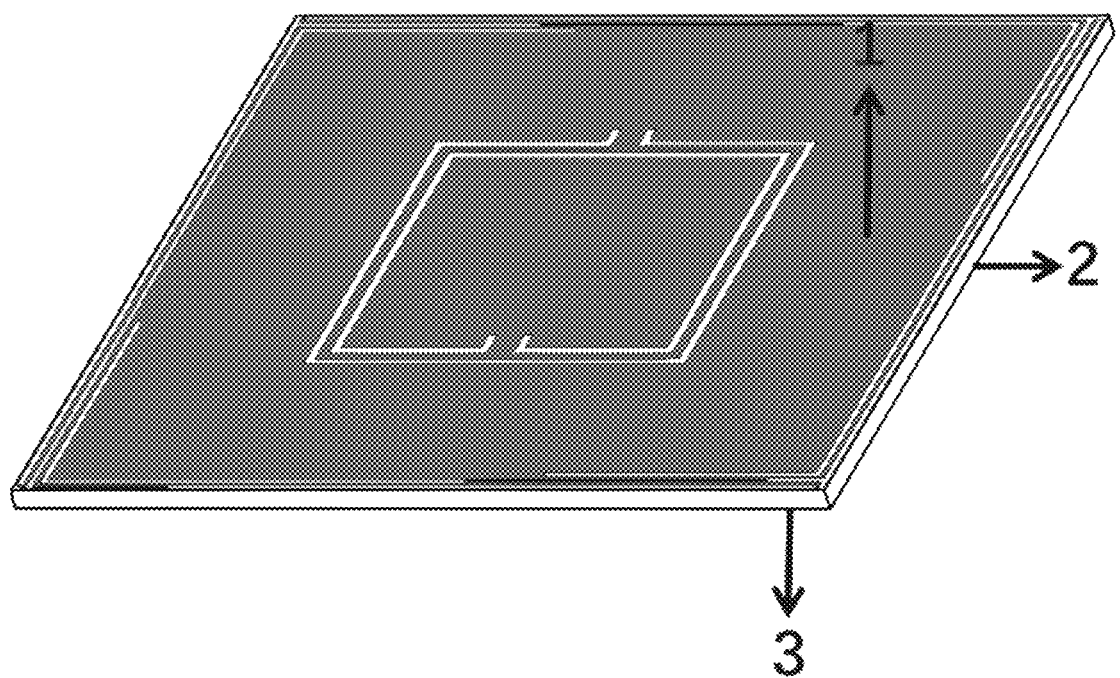
FIG. 1 is a perspective view of an electromagnetic band gap (EBG) unit according to an embodiment of the present disclosure.

In the drawings: 1, power plane; 2, dielectric substrate; 3, ground plane; 4, coupled complementary split ring resonator; 41, first rectangular ring; 42, second rectangular ring; 5, first horizontal branch; 6, first vertical branch; 7, second horizontal branch; 8, second vertical branch; 9, first coupling wire; and 10, second coupling wire.

DETAILED DESCRIPTION OF EMBODIMENTS

The technical solutions in the embodiments of the present disclosure will be described clearly and completely below with reference to the accompanying drawings. Obviously, the described embodiments are only some embodiments of the present disclosure, instead of all embodiments. Based on the embodiments in the present disclosure, all other embodiments obtained by one of ordinary skill in the art without making creative labor shall fall within the scope of protection of the present disclosure.

An object of the present disclosure to provide an ultra-wideband electromagnetic band gap (EBG) structure and a circuit board to effectively suppress simultaneous switching noise (SSN) while maintaining good signal integrity.

To make the above objects, features and advantages of the present disclosure more obvious and understandable, the present disclosure will be described in further detail below with reference to the accompanying drawings and embodiments.

As shown in FIG. 1, the present disclosure provides an ultra-wideband EBG structure, including a plurality of EBG units arranged in an array. Each of the plurality of EBG units includes a power plane 1, a dielectric substrate 2 and a ground plane 3 arranged sequentially from top to bottom.

The power plane 1 includes a patch, a coupled complementary split ring resonator (C-CSRR) 4 and a plurality of semi-improved Z-bridge structures. The C-CSRR 4 is embedded in the patch. Specifically, the C-CSRR 4 is embedded in the center of a square patch.

Each edge of the patch is provided with a semi-improved Z-bridge structure. The C-CSRR 4 is provided within a ring formed by the plurality of the semi-improved Z-bridge structures. Each of the plurality of semi-improved Z-bridge structures includes a first horizontal branch 5, a first vertical branch 6, a second horizontal branch 7 and a second vertical branch 8 connected in sequence. The second vertical branch 8 is connected to the patch. The first horizontal branch 5 is parallel to the second horizontal branch 7. The first vertical branch 6 is parallel to the second vertical branch 8. The first horizontal branch 5 is perpendicular to the first vertical branch 6. The first horizontal branches 5 of adjacent EBG units are connected to each other.

The distance between the first horizontal branch 5 and the second horizontal branch 7, the distance between the second horizontal branch 7 and the patch, the width of the second vertical branch 8 and the width of the second horizontal branch 7 are equal. The width of the first horizontal branch 5 is equal to the width of the first vertical branch 6, and is smaller than the width of the second horizontal branch 7.

The C-CSRR 4 includes a first rectangular ring 41 and a second rectangular ring 42. The second rectangular ring 42 is provided within the first rectangular ring 41. A side of the first rectangular ring 41 is provided with a first opening. A side of the first opening close to the semi-improved Z-bridge structures is further provided with a pair of first coupling wires 9. Each of the pair of first coupling wires 9 is perpendicularly connected to an end of the first opening.

A side of the second rectangular ring 42 is provided with a second opening. A side of the second opening close to the center of the patch is further provided with a pair of second coupling wires 10. Each of the pair of second coupling wires 10 is perpendicularly connected to an end of the second opening. A connection line between the first opening and the second opening passes through the center of the patch.

The power plane 1 is made of copper with a thickness of 0.035 mm, and is a patterned plane. The dielectric substrate 2 is made of a glass fiber-reinforced epoxy resin (flame retardant 4, FR-4). The dielectric substrate 2 has a relative dielectric constant of 4.4, a loss tangent of 0.02, and a thickness of 0.4 mm. The ground plane 3 is made of copper, which remains intact and has a thickness of 0.035 mm. The thickness of the power plane 1 is the same as that of the ground plane 3.

The present disclosure also provides a circuit board, which includes a top dielectric substrate, a bottom dielectric substrate and the aforementioned ultra-wideband EBG structure.

The power plane 1 of each EBG unit is provided between the dielectric substrate 2 and the top dielectric substrate; and the ground plane 3 of each EBG unit is provided between the dielectric substrate 2 and the bottom dielectric substrate. In other words, a 4-layer printed circuit board (PCB) is designed on the basis of the original 3*3 EBG. Specifically, an FR-4 dielectric layer with the same thickness as the dielectric substrate 2 is added above the power plane of the EBG, and another FR-4 dielectric layer with the same thickness as the dielectric substrate 2 is added below the ground plane of the EBG, so that a 4-layer PCB structure is formed.

The direct current (DC) flow will cause a voltage drop (known as IR-Drop) on the EBG plane, which will affect the power chain in the multilayer PCB. Therefore, in the PDN, it is necessary to accurately analyze the IR-Drop in the EBG plane. A perfect electric conductor auxiliary brick is also provided in the center of the C-CSRR 4 at each of the two distal ends of the diagonal of the 3*3 EBG square.

Figure 2:
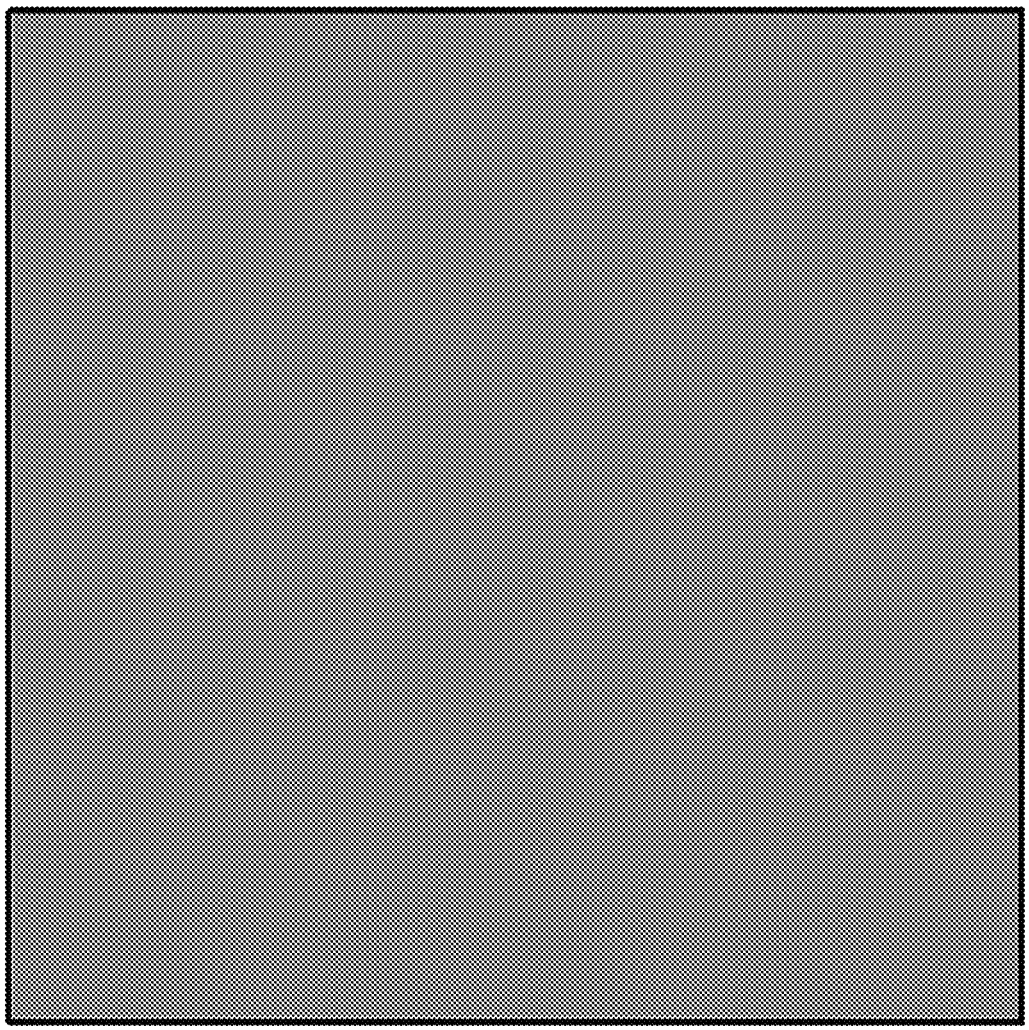
FIG. 2 is a schematic diagram of a bottom surface of the EBG unit (i.e., the ground plane) according to an embodiment of the present disclosure.

The EBG structure of the present disclosure is an improved EBG structure having an embedded structure, which includes a patterned power plane 1, an FR-4 dielectric substrate, and a complete ground plane. The FR-4 is arranged between the power plane 1 and the complete ground plane, as shown in FIGS. 1 and 2.

Figure 3:
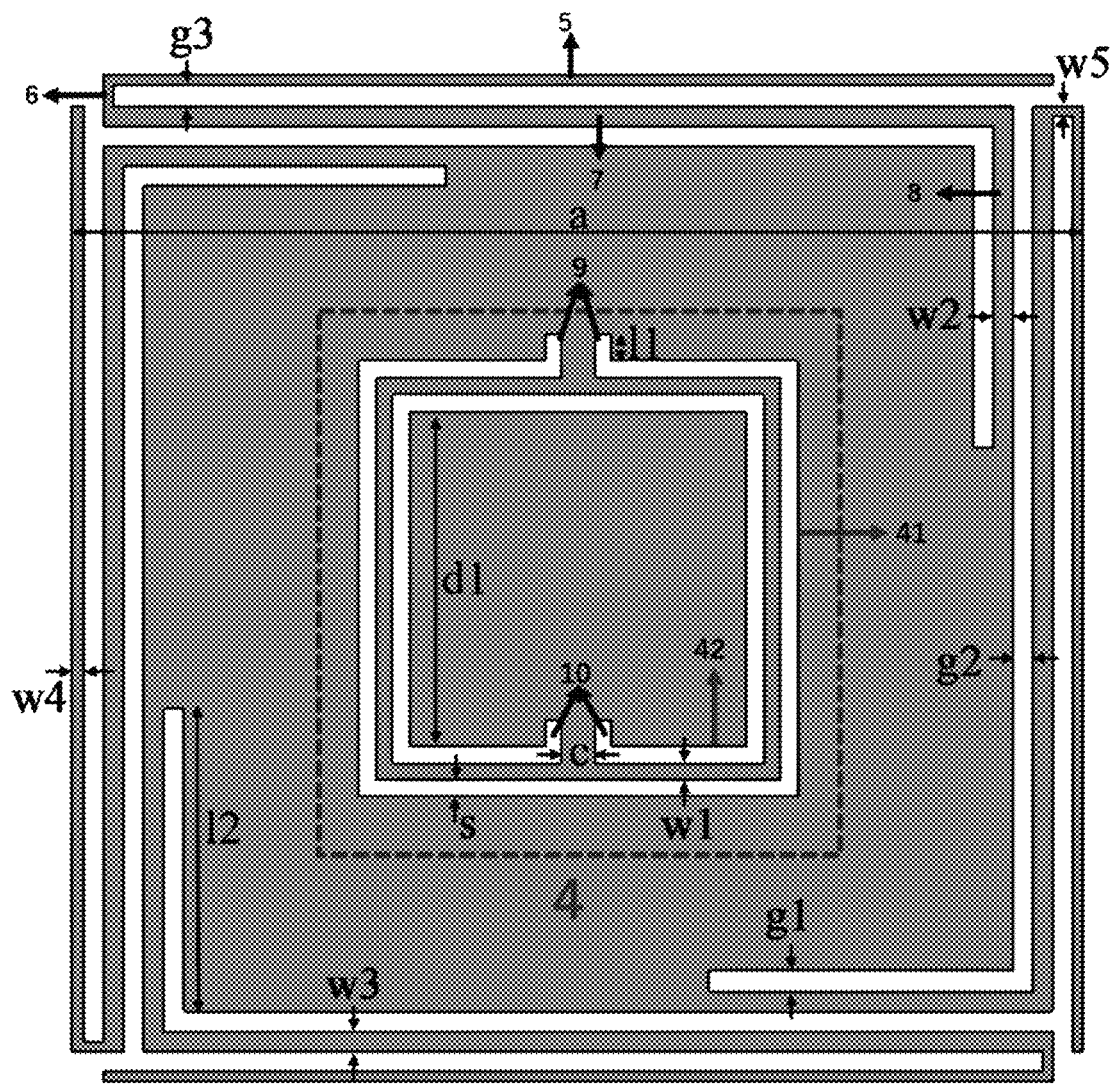
FIG. 3 is a schematic diagram of a power plane of the EBG unit according to an embodiment of the present disclosure.

The patterned power plane is formed by embedding a C-CSRR 4 in a square patch, which constitutes a unit of the EBG structure, and is made of copper. The EBG units are connected to each other by an improved Z-bridge. As shown in FIG. 3, the structural parameters of the patterned power plane are as follows: the side length a of the power plane 1 is 30 mm; the distance w1 between the first rectangular ring 41 and the second rectangular ring 42 is 0.4 mm; the width w2 of the second vertical branch 8 is 0.2 mm, and is equal to the width w3 of the second horizontal branch 7, the distance g2 between the second horizontal branch 7 and the patch, and the distance g3 between the first horizontal branch 5 and the second horizontal branch 7; the width w4 of the first horizontal branch 5 is 0.1 mm, and equal to the width w5 of the first vertical branch 6; the distance g1 between the second vertical branch 8 and the patch is 0.3 mm; the length l1 of the coupling line is 0.68 mm; the length l2 of the second vertical branch 8 corresponding to the patch is 9 mm; the inner length d1 of the second rectangular ring 42 is 10 mm; the length c of the opening is 0.6 mm; and the width s of the two rings of the coupled complementary split ring resonator is 0.3 mm.

Figure 15:
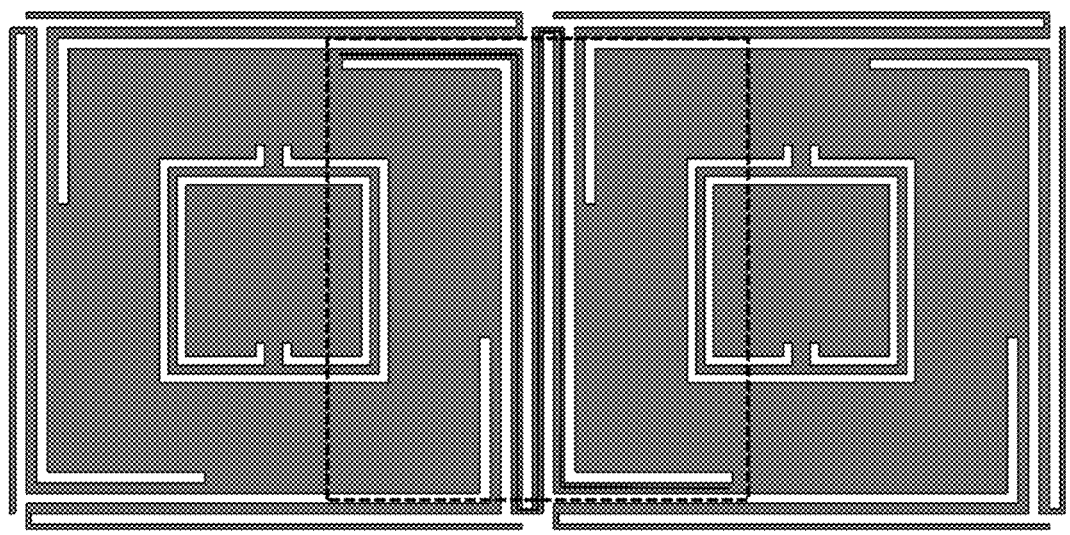
FIG. 15 is a schematic diagram of an improved Z-bridge structure according to an embodiment of the present disclosure.
Figure 16:
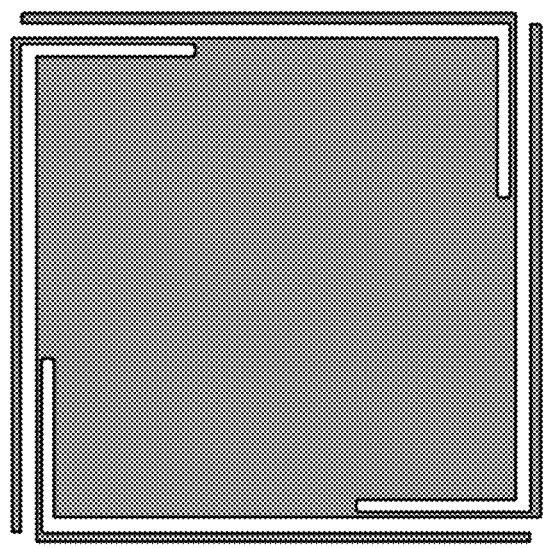
FIG. 16 is a schematic diagram of a Z-bridge structure of a power plane of a conventional EBG structure unit in the prior art.

The series inductance between units is increased by an improved Z-bridge as shown in the dashed box in FIG. 15, so that the alternating inductance values produced by the combination of the "improved Z-bridge" connection and the patch structure act as a stopband. The inductive inductance is generated by the interconnecting metal branches between the units and the C-CSRR inside the units. The gap between the C-CSRR generates a gap capacitance. The length of the improved Z-bridge is larger than that of the traditional Z-bridge, which can increase the inductance of the LC equivalent circuit, thereby reducing the lower cut-off frequency of the EBG structure and increasing the effect of bandstop suppression width. FIG. 16 shows the power plane of the traditional Z-bridge EBG structure unit. When the EBG operates at high frequencies, the difference between the overall length of the EBG structure unit and the operating wavelength is small. As a result, the equivalent circuit model will no longer be applicable. At this time, a parallel-plate resonant cavity is formed between the power plane 1 and the ground plane 3. Hence, the parallel-plate resonant cavity model is used to predict the upper cutoff frequency, and the upper cutoff frequency can be increased by embedding the C-CSRR. Therefore, the structure can suppress the ultra-wideband SSN. Furthermore, the differential signal is used to transmit for structure to ensure good signal integrity.

Figure 4:
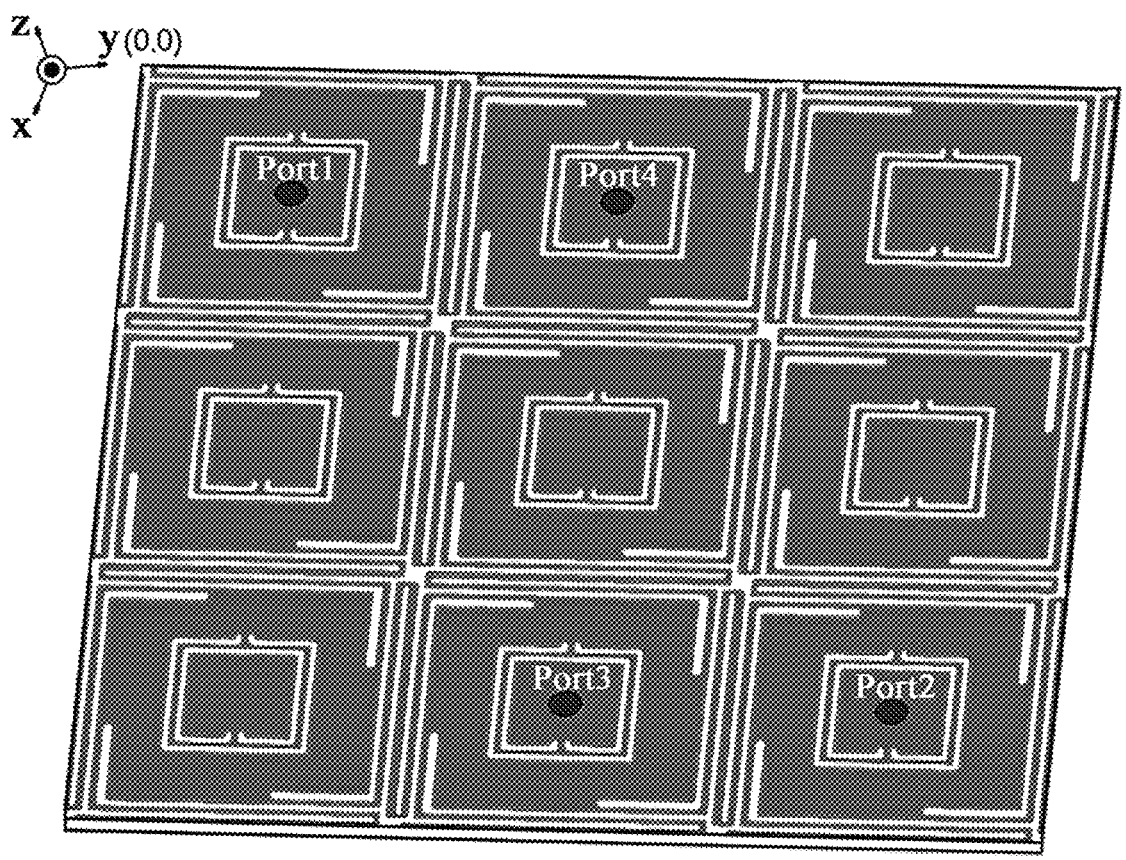
FIG. 4 is a perspective view of a 3*3 EBG structure according to an embodiment of the present disclosure.
Figure 5:
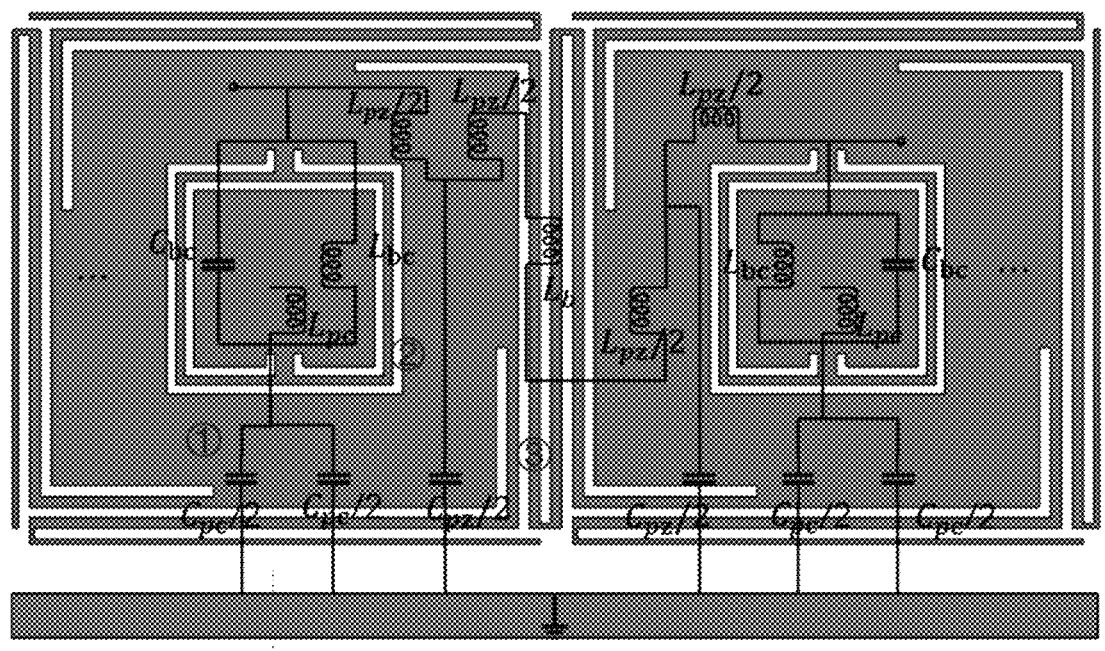
FIG. 5 is a simplified equivalent circuit model diagram of the EBG unit according to an embodiment of the present disclosure.

FIG. 3 shows the power plane of the EBG structure unit with the improved Z-bridge as a roundabout Z-bridge, in which the C-CSRR is embedded and a pair of coupling lines are added at the open end of each open ring of the CSRR. This arrangement changes the equivalent circuit parameters of the whole structure and thus exhibits a different frequency response. FIG. 4 shows a double-layer PCB with a total size of 90×90×0.4 $mm^3$, which is composed of 3*3 EBG structural units. The four ports of the double-layer PCB are shown in FIG. 4, and the equivalent circuit model is shown in FIG. 5, which characterizes the propagation behavior between the power plane 1 of the EBG structure and the continuous ground plane at low frequencies. Since the slender transmission wire capacitance of the improved EBG structure and the plane gap capacitance between the two structural units are small enough to be approximated as open circuits, so the equivalent circuit model ignores the effects of $C_g$ and $C_b$ on the circuit. $L_{pc}$ and $C_{pc}$ represent the equivalent inductance and capacitance of the C-CSRR patch, respectively, expressed as:

$$L_{pc}=\mu_0 h l_{en1}/w1;\text{ and}$$

$$C_{pc}=\varepsilon_0\varepsilon_r d1^2/h;$$

where d1 is defined as in FIG. 3; h represents the thickness of the dielectric plate; $l_{en1}$ represents the length of the C-CSRR bridge; w1 is defined as in FIG. 3; $\varepsilon_r$ represents the dielectric coefficient of the substrate; and $\mu_0$ and $\varepsilon_0$ are the permeability and dielectric coefficient of the free space, respectively.

$C_{bc}$ and $L_{bc}$ are the capacitance and inductance of the coplanar waveguide (CPW) of the connecting bridge in the CSRR, respectively, which can be calculated by the following formulas:

$$C_{bc}=\varepsilon_0\varepsilon_r 4w1(d1+2s+w1)/h;$$

$$L_{bc}=(d1+2s+w1)L_{pul};\text{ and}$$

$$L_{pul}=Z_{CPW}\sqrt{\varepsilon_{effc}}/c;$$

where s is defined as in FIG. 3; $L_{pul}$ is the inductance per unit length of the CPW; $Z_{CPW}$ and $\varepsilon_{effc}$ are characteristic impedance and effective dielectric constant, respectively; and C represents the speed of light in free space.

$L_{pz}$ and $C_{pz}$ represent the equivalent inductance and capacitance of the ¼ square annular metal patch, respectively, which are calculated by the following formulas:

$$L_{pz}=\mu_0 h l_{en2}/w;\text{ and}$$

$$C_{pz}=\varepsilon_0\varepsilon_r S_p/h;$$

where $S_p$ denotes the front area of the patch; $l_{en2}$ represents the transmission length of the improved Z-bridge; and w represents the connecting width of the bridge.

$L_b$ is the equivalent inductance of the new Z-bridge. $C_g$ is the gap capacitance; $C_b$ is the capacitance of the connecting bridge to the ground. $C_g$ and $C_b$ are omitted in the simplified circuit model. $L_b$, $C_b$, and $C_g$ are calculated by the following formulas:

$$L_b = l_{en2} \times k \times \ln\frac{2\pi h}{w};$$

$$C_b = l_{en2}\frac{0.67(1.41+\varepsilon_r)}{\ln\left(\frac{7.5h}{w}\right)};$$

and $$C_g = \frac{\varepsilon_0(1+\varepsilon_r)l}{\pi}\cosh^{-1}\frac{p}{g};$$

where k is the constant of 0.2 n H/mm; l is the side length of the EBG unit block; p is the cycle length of the EBG unit block; and g is the distance between adjacent units.

The circuit is formed by cascading three resonant circuit loops, i.e., the circuits ①-③ shown in FIG. 5, and the resonance points are expressed as:

$$f_{L1} = \frac{1}{\pi}\cdot\sqrt{1/2L_{pc}C_{pc}};$$

$$f_{L2} = \frac{1}{\pi}\cdot\sqrt{(C_{pc}+C_{pz})/(C_{pc}C_{pz}(L_{p2}+2L_{bc}))};$$

and $$f_{L3} = \frac{1}{\pi}\cdot\sqrt{1/(C_{pz}(L_{pz}+L_b))}.$$

Figure 6:
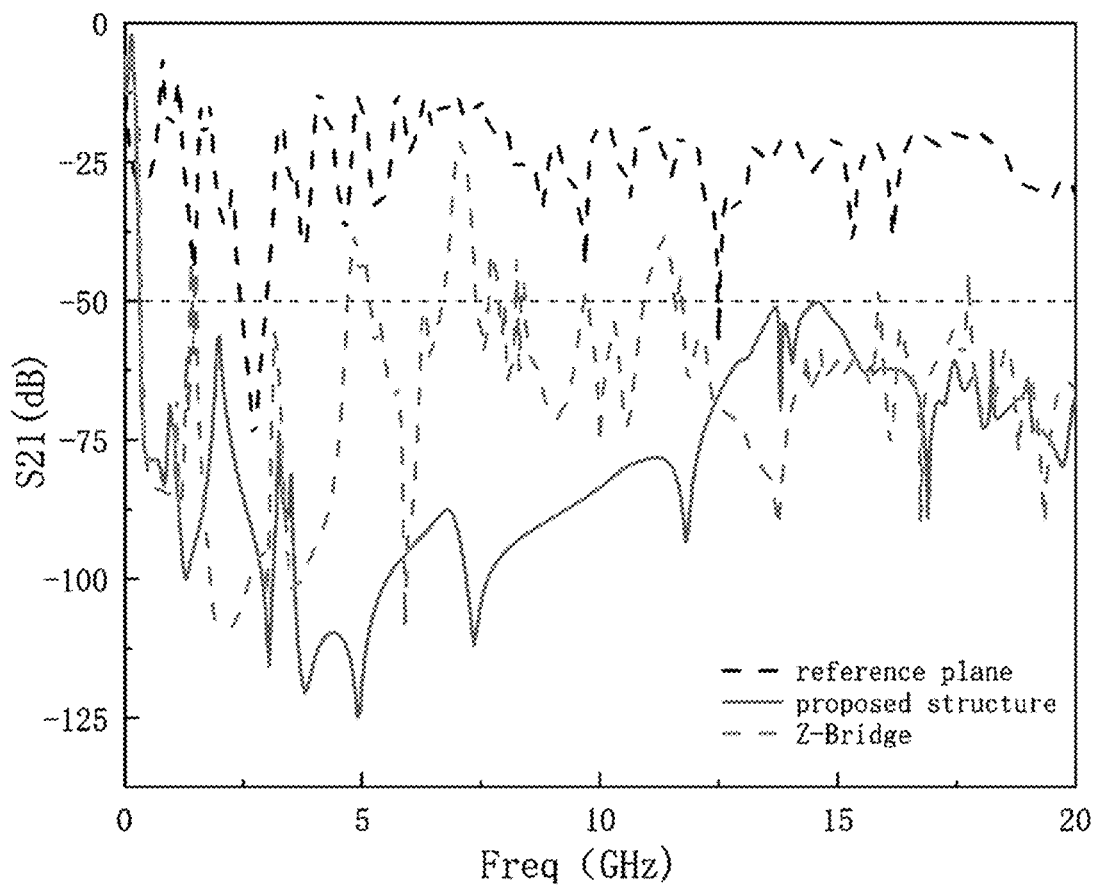
FIG. 6 shows S21 simulation results of different EBG structures according to an embodiment of the present disclosure.

Due to the cascading of the three resonant circuit loops, the lower cutoff frequency $f_L$ of the structure should be the smallest among the three resonant frequencies, i.e., $f_L$=Min ($f_{L1}$, $f_{L2}$, $f_{L3}$), where $f_{L1}$ is the resonant frequency point of loop ①; $f_{L2}$ is the resonant frequency point of loop ②; and $f_{L3}$ is the resonant frequency point of loop ③. Accordingly, the $f_L$ can be calculated to be 308 MHz. Meanwhile, the performance of the structure is verified by software simulation, and the results of the S21 are shown in FIG. 6. Compared with the conventional Z-bridge, the EBG structure has the effect of ultra-wideband SSN suppression at −50 dB suppression depth, with a resistance band range of 320 MHz-20 GHz. The lower cutoff frequency obtained by actual simulation is 12 MHz different from the theoretical value calculated above, due to the fact that the capacitance is neglected in the estimation based on the equivalent circuit.

Figure 7:
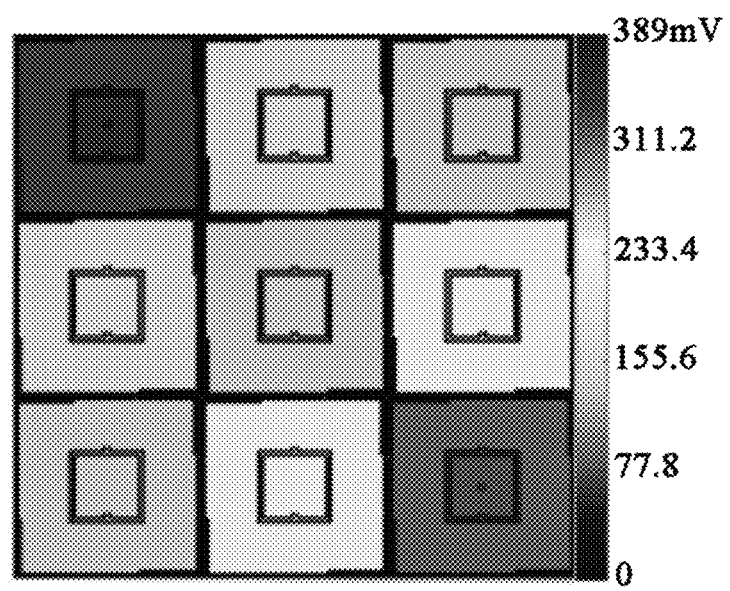
FIGS. 7-10 schematically show effects of copper thickness on IR-Drop of the EBG structure according to an embodiment of the present disclosure, where
Figure 8:
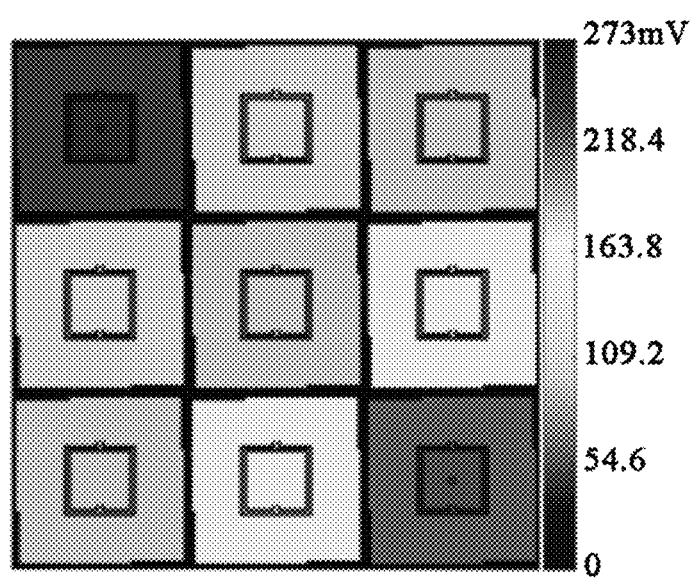
Figure 9:
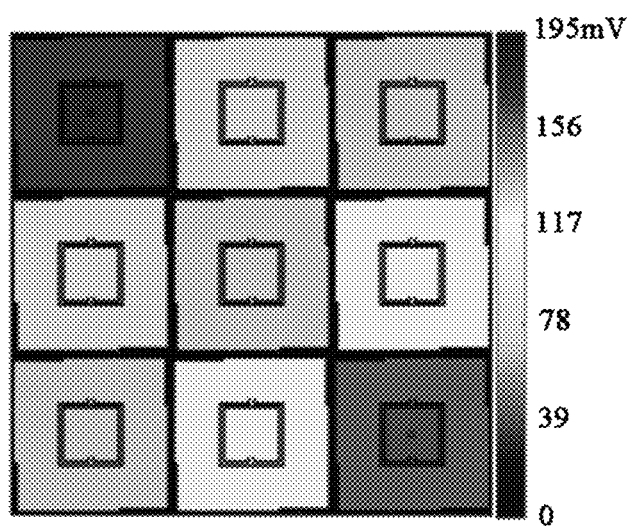
Figure 10:
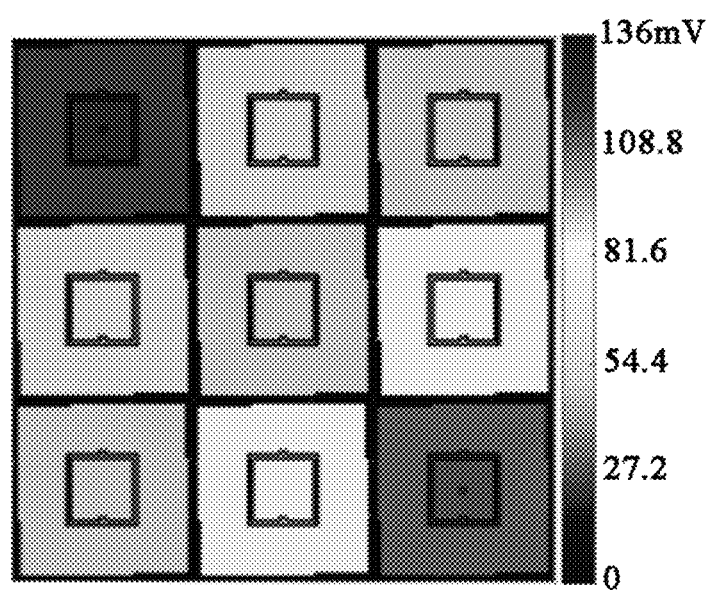

As shown in FIGS. 7-10, two perfect conductor auxiliary bricks are added to ports 1 and 2 in the above-mentioned structure, and the conductor auxiliary bricks each are a 1\*1\*0.1 mm rectangle with a thickness of 0.1 mm, where the centers of ports 1 and 2 are located at the same positions as the centers of ports 1 and 2 as shown in FIG. 4, namely, respectively at the center of the upper-left and lower-right units of the 3\*3 structure, as shown in FIG. 7. The port 1 provides a 1A dc input current, while the port 2 is used for outputting a 1A current, and the voltage distribution in the EBG plane can be calculated. FIG. 7 shows the effect of 0.035 mm copper thickness on the IR-Drop, FIG. 8 shows the effect of 0.05 mm copper thickness on the IR-Drop, FIG. 9 shows the effect of 0.07 mm copper thickness on the IR-Drop, and FIG. 10 shows the effect of 0.1 mm copper thickness on the IR-Drop. FIG. 7 further shows the dc voltage drop when the copper foil thickness is 0.035 mm, and the dc impedance can be calculated to be 389 mΩ according to Ohm's law, which is relatively large. This is because the dc impedance of the improved EBG is larger owing to its complex structure, that is, the longer and narrower connecting bridge of the novel EBG impedes the flow of dc current, resulting in an elevated dc impedance of the novel EBG. In addition, the insertion of C-CSRR also makes the impedance larger. Therefore, the dc impedance is reduced by increasing the thickness of the copper foil in the power plane. FIG. 8 shows a dc impedance of 273 mΩ at a copper thickness of 0.05 mm, FIG. 9 shows a dc impedance of 195 mΩ at a copper thickness of 0.07 mm, and FIG. 10 shows a dc impedance of 136 mΩ at a copper thickness of 0.1 mm. It indicates that the dc impedance decreases with the increase in copper thickness. Hence, the dc impedance of the power plane 1 of the EBG can be reduced by increasing the copper thickness, thus reducing the effect on current transmission.

Figure 11:
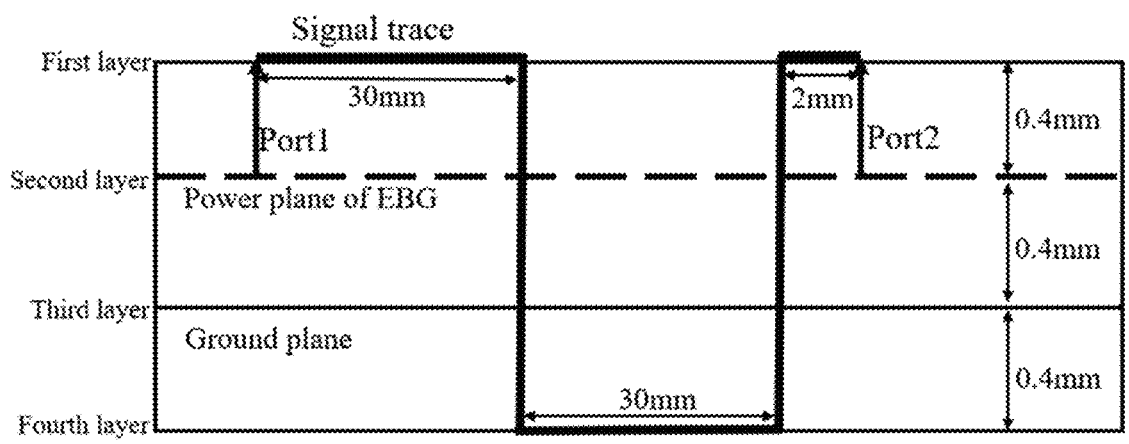
FIG. 11 is a cross-section view of a signal transmission wire of a 4-layer printed circuit board (PCB) according to an embodiment of the present disclosure.
Figure 12:
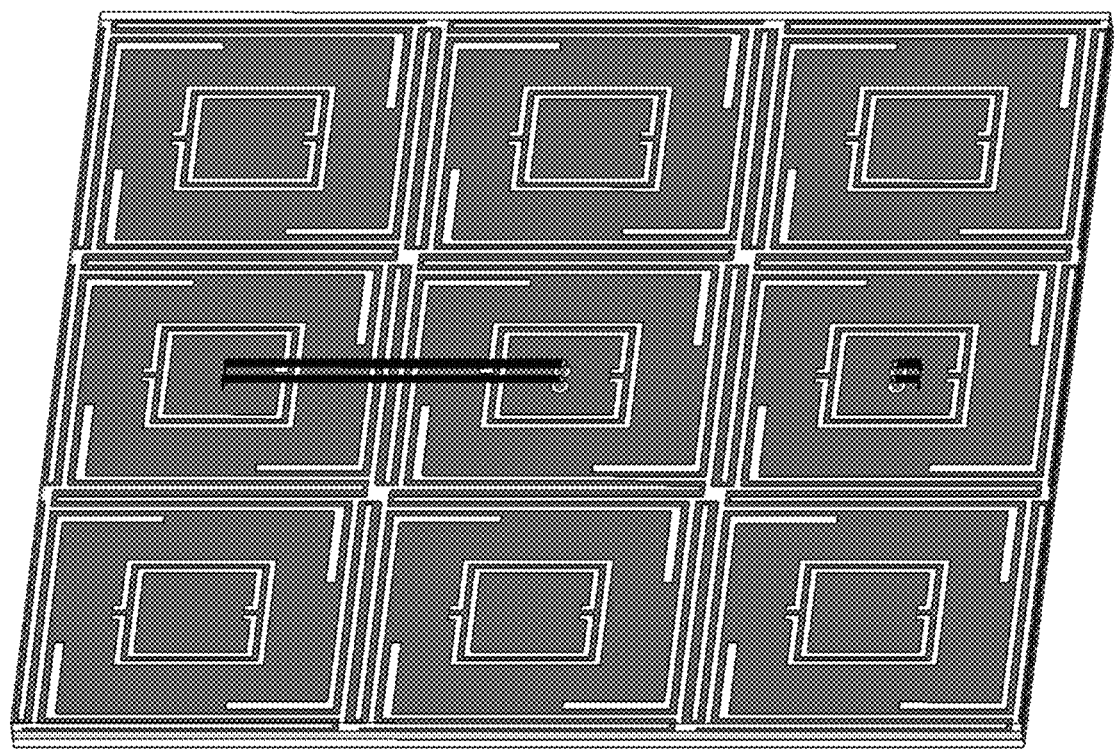
FIG. 12 is a perspective view of a differential pair for signal transmission according to an embodiment of the present disclosure.
Figure 13:
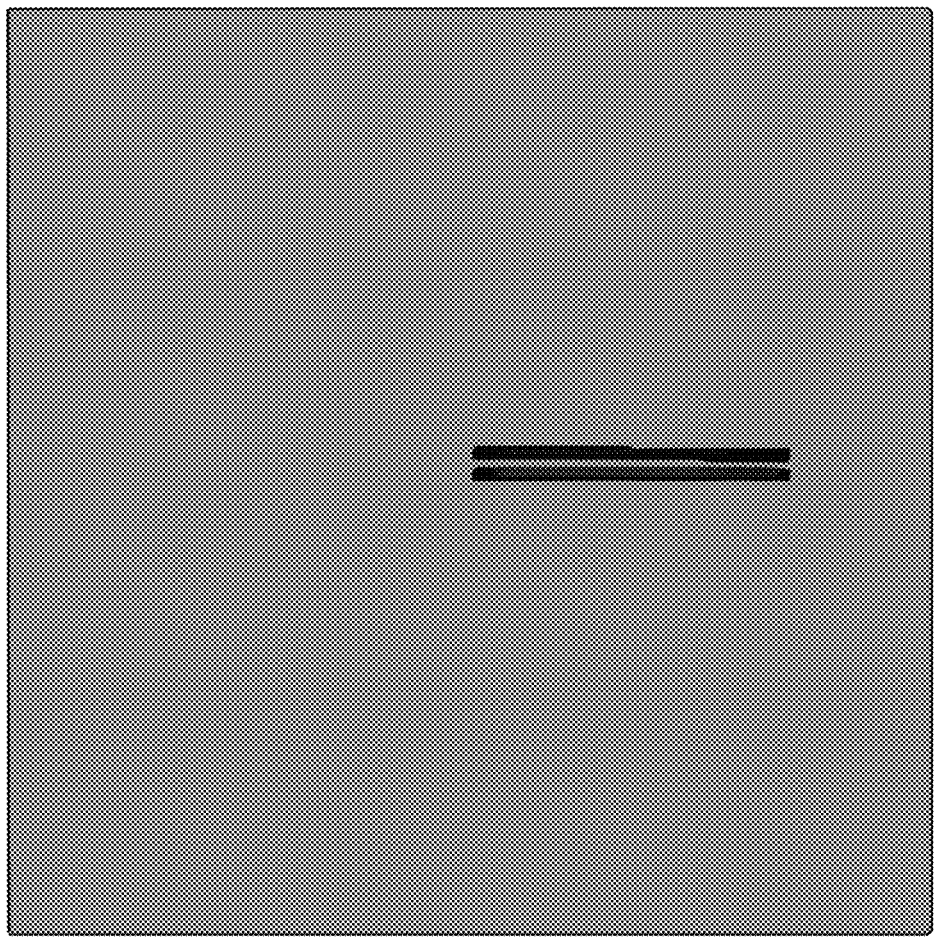
FIG. 13 is a backside view of the differential pair according to an embodiment of the present disclosure.
Figure 14:
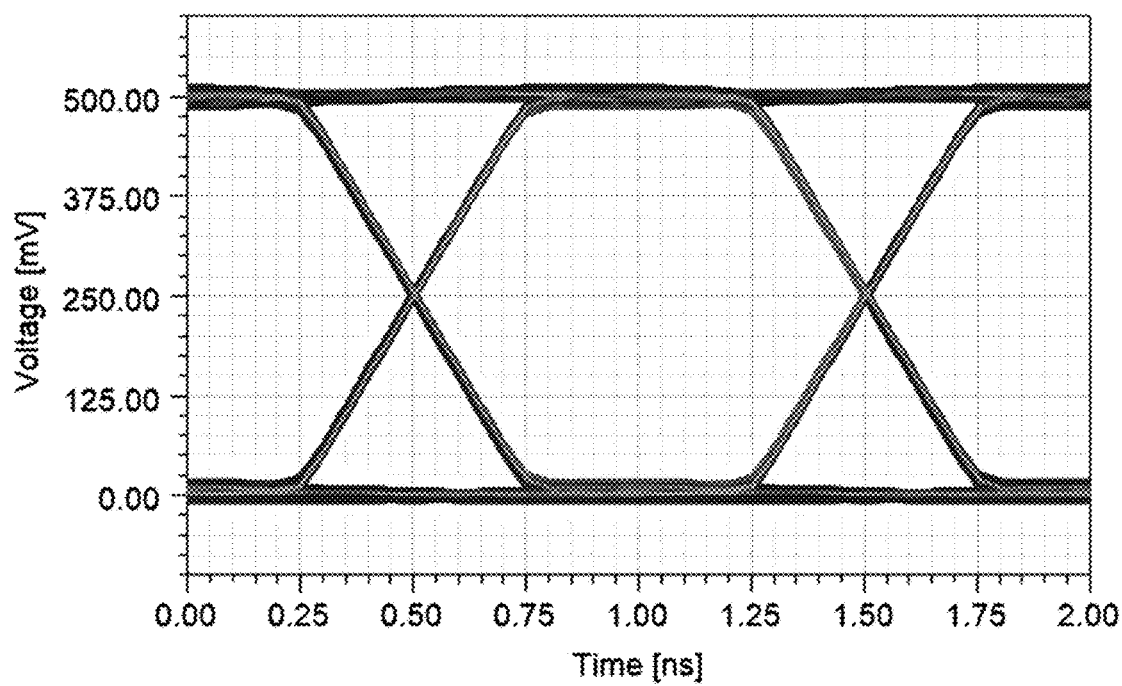
FIG. 14 shows an eye diagram simulation result of the differential pair according to an embodiment of the present disclosure.

The structure provided by the present disclosure can effectively suppress SSN, but the etching on the power plane 1 leads to deterioration of the signal transmission quality. Therefore, it is necessary to analyze the signal transmission characteristics. To test the effect of the power plane of the EBG on the signal integrity (SI), a four-layer circuit board is designed in the present disclosure. As shown in FIG. 11, a signal transmission profile of a 4-layer PCB is illustrated, where the signal traces arrive at the fourth layer from the first layer through a via hole, and then return to the first layer through a via hole; the second layer is the etched power plane of the EBG; and the third layer is the solid ground plane. The thickness of each FR-4 layer is 0.4 mm. Each FR-4 substrate layer has a thickness of 0.4 mm. Each signal trace has a total length of 62 mm, a line width of 1 mm and a characteristic impedance is 50 ohms. Port 1 and port 2 are located at the two ends of the signal trace, respectively. Eye-diagram simulation is an important indicator of the quality of signal transmission in PCB. The quality of the eye diagram is mainly determined by two parameters, namely, maximum eye width (MEW) and maximum eye height (MEO). The eye width indicates the timing jitter of the signal on the transmission wire, while the eye height reflects the noise tolerance of the signal on the transmission wire. For the power plane of the new EBG structure, when a single signal line is used for transmission, due to the effect of noncontinuous structure (e.g., slot line) in the structure unit, the continuity of the return current path is broken, thereby severely deteriorating the signal quality, and degrading the SI performance. To improve the SI performance, a differential signal pair is used rather than the single transmission wire for signal transmission. As shown in FIG. 12 and FIG. 13, FIG. 12 shows the three-dimensional diagram of the differential signal pair for signal transmission, and FIG. 13 shows the backside diagram of the differential signal pair for signal transmission. The width of the signal line is 1 mm, the distance between two signal lines is 1 mm, and the length of each signal line is kept at 62 mm. FIG. 14 shows the eye-diagram simulation results of the differential signal pair for signal transmission, from which it can be clearly observed that the maximum eye width is 974.7 ps, the maximum eye height is 456.9 mV, and the signal waveform is basically kept intact. Therefore, when the differential signal is used for the transmission, no serious SI problem exist and a good signal integrity is exhibited.

The present disclosure adopts an embedded improved structure with a thicker dielectric platen, namely a thickness of 0.4 mm, which has a lower cut-off frequency and a resistive bandwidth of more than 20 GHz, achieving an ultra-broadband effect. At the same time, the suppression depth of the simultaneous switching noise can be greatly improved to less than −50 dB. The IR-Drop is also simulated, and the results show that the dc resistance can be reduced by increasing the thickness of the copper foil, thus reducing the impact on current transmission. Furthermore, the SI performance is good and the eye diagram waveform remains intact and undistorted when a differential signal is used for transmission.

Individual embodiments in this specification are described in a progressive manner, and focuses on the differences from other embodiments, and reference can be made therebetween for the same and similar parts. In this disclosure, the principles and implementations of the present disclosure are elaborated using specific examples, and the above examples are only used for facilitating understanding the method and core ideas of the present disclosure. It should be understood that various changes, modifications and replacements made by one of ordinary skill int the art without departing from the spirit of the disclosure shall fall within the scope of the present disclosure defined by the appended claims.

What is claimed is:

1. An ultra-wideband electromagnetic band gap (EBG) structure, comprising:
    a plurality of EBG units arranged in an array;
    wherein each of the plurality of EBG units comprises a power plane, a dielectric substrate and a ground plane arranged sequentially from top to bottom;
    the power plane comprises a patch, a coupled complementary split ring resonator (C-CSRR) and a plurality of semi-improved Z-bridge structures;
    the C-CSRR is embedded in the patch;
    each edge of the patch is provided with at least one of the plurality of semi-improved Z-bridge structures; the C-CSRR is provided within a ring formed by the plurality of semi-improved Z-bridge structures; each of the plurality of semi-improved Z-bridge structures comprises a first horizontal branch, a first vertical branch, a second horizontal branch and a second vertical branch connected in sequence; the second vertical branch is connected to the patch; the first horizontal branch is parallel to the second horizontal branch; the first vertical branch is parallel to the second vertical branch; the first horizontal branch is perpendicular to the first vertical branch; and for adjacent EBG units among the plurality of EBG units, the first horizontal branch of one of the adjacent EBG units is connected to the first horizontal branch of the other of the adjacent EBG units;
    the C-CSRR comprises a first rectangular ring and a second rectangular ring; and the second rectangular ring is provided within the first rectangular ring;
    a side of the first rectangular ring is provided with a first opening; a side of the first opening close to the plurality of semi-improved Z-bridge structures is provided with a pair of first coupling wires; and each of the pair of first coupling wires is perpendicularly connected to an end of the first opening; and
    a side of the second rectangular ring is provided with a second opening; a side of the second opening close to a center of the patch is provided with a pair of second coupling wires; each of the pair of second coupling wires is perpendicularly connected to an end of the second opening; and a connection line between the first opening and the second opening is configured to pass through the center of the patch.

2. The ultra-wideband EBG structure of claim 1, wherein a distance between the first horizontal branch and the second horizontal branch, a distance between the second horizontal branch and the patch, a width of the second vertical branch and a width of the second horizontal branch are equal; and a width of the first horizontal branch is equal to a width of the first vertical branch, and is smaller than the width of the second horizontal branch.

3. The ultra-wideband EBG structure of claim 1, wherein the power plane is made of copper.

4. The ultra-wideband EBG structure of claim 1, wherein the dielectric substrate is made of a glass fiber-reinforced epoxy resin, and has a relative dielectric constant of 4.4 and a loss tangent of 0.02.

5. The ultra-wideband EBG structure of claim 1, wherein the ground plane is made of copper.

6. The ultra-wideband EBG structure of claim 1, wherein a thickness of the power plane is the same as that of the ground plane.

7. A circuit board, comprising:
a top dielectric substrate;
a bottom dielectric substrate; and
the ultra-wideband EBG structure of claim 1;
wherein the power plane of each of the plurality of EBG units is provided between the dielectric substrate and the top dielectric substrate; and the ground plane of each of the plurality of EBG units is provided between the dielectric substrate and the bottom dielectric substrate.

* * * * *